(12) United States Patent
Eliashevich et al.

(10) Patent No.: US 7,078,319 B2
(45) Date of Patent: Jul. 18, 2006

(54) LASER SEPARATED DIE WITH TAPERED SIDEWALLS FOR IMPROVED LIGHT EXTRACTION

(75) Inventors: Ivan Eliashevich, Maplewood, NJ (US); Mark Gottfried, Hillsborough, NJ (US)

(73) Assignee: GELcore LLC, Valley View, OH (US)

( * ) Notice: Subject to any disclaimer, the term of this patent is extended or adjusted under 35 U.S.C. 154(b) by 16 days.

(21) Appl. No.: 10/432,081

(22) PCT Filed: Nov. 16, 2001

(86) PCT No.: PCT/US01/43326
§ 371 (c)(1),
(2), (4) Date: Feb. 6, 2004

(87) PCT Pub. No.: WO02/41362
PCT Pub. Date: May 23, 2002

(65) Prior Publication Data
US 2004/0118825 A1 Jun. 24, 2004

(51) Int. Cl.
*H01L 21/301* (2006.01)
*H01L 21/46* (2006.01)
*H01L 21/78* (2006.01)

(52) U.S. Cl. ............................ 438/463; 438/948
(58) Field of Classification Search ............... 438/68, 438/462, 463, 948, 949, 940
See application file for complete search history.

(56) References Cited

U.S. PATENT DOCUMENTS

| | | |
|---|---|---|
| 3,824,678 A | 7/1974 | Harris et al. |
| 3,970,819 A | 7/1976 | Gates et al. |
| 4,080,245 A | 3/1978 | Yamanaka et al. |
| 4,279,690 A | 7/1981 | Dierschke |
| 4,564,946 A * | 1/1986 | Olsson et al. .................. 372/20 |
| 4,841,344 A | 6/1989 | Heinen |
| 4,856,014 A | 8/1989 | Figueroa et al. |
| 4,905,058 A | 2/1990 | Yamada et al. |
| 5,087,949 A | 2/1992 | Haitz |
| 5,151,389 A | 9/1992 | Zappella |
| 5,349,211 A | 9/1994 | Kato |
| 5,610,412 A | 3/1997 | Awano et al. |
| 5,705,834 A | 1/1998 | Egalon et al. |
| 5,714,403 A | 2/1998 | Nissim et al. |
| 5,832,595 A * | 11/1998 | Maruyama et al. ........... 29/829 |
| 5,898,191 A | 4/1999 | Kwon et al. |
| 5,916,460 A | 6/1999 | Imoto et al. |
| 5,922,224 A | 7/1999 | Broekroelofs |
| 5,932,118 A | 8/1999 | Yamamoto et al. |

(Continued)

OTHER PUBLICATIONS

"Extraction Efficiency of GaN-Based LEDs", Sven-Silvius Schad, Annual Report 2000, Optoelectronics Department, University of Ulm.

(Continued)

*Primary Examiner*—Matthew Smith
*Assistant Examiner*—S. V. Clark
(74) *Attorney, Agent, or Firm*—Fay, Sharpe, Fagan, Minnich & McKee, LLP

(57) ABSTRACT

A method for separating individual optoelectronic devices, such as LEDs, from a wafer includes directing a laser beam having a width toward a major surface of the semiconductor wafer. The laser beam has an image with a first portion of a first energy per unit width and a second portion of a second energy per unit width less than the first energy. The laser beam image cuts into the first major surface of the semiconductor wafer to produce individual devices.

26 Claims, 8 Drawing Sheets

U.S. PATENT DOCUMENTS

| | | | |
|---|---|---|---|
| 6,011,271 A * | 1/2000 | Sakuma et al. | 257/14 |
| 6,015,719 A | 1/2000 | Kish, Jr. et al. | |
| 6,025,251 A | 2/2000 | Jakowetz et al. | |
| 6,063,695 A | 5/2000 | Lin et al. | |
| 6,155,699 A | 12/2000 | Miller et al. | |
| 6,163,353 A | 12/2000 | Ting | |
| 6,165,809 A | 12/2000 | Kurahashi | |
| 6,215,134 B1 | 4/2001 | O'Brien | |
| 6,229,160 B1 | 5/2001 | Krames et al. | |
| 6,235,547 B1 * | 5/2001 | Sakuma et al. | 438/44 |
| 6,261,856 B1 | 7/2001 | Shinohara et al. | |
| 6,280,861 B1 | 8/2001 | Hosokawa et al. | |
| 6,489,801 B1 * | 12/2002 | Borden et al. | 324/766 |
| 6,723,952 B1 * | 4/2004 | Choo et al. | 219/121.72 |
| 6,911,377 B1 * | 6/2005 | Nepomuceno et al. | 438/462 |
| 2001/0045690 A1 * | 11/2001 | Brandinger | 264/400 |

OTHER PUBLICATIONS

"Surface Texturing Boosts Light Emission in New-Generation AllnGaP LED Chips", Linder et al., 2001 *Compound Semiconductor* Magazine, May 2001.

Osram Opto Semiconductors Enhances Brightness of Blue InGan-LEDs, Zehnder et al., *Compound Semiconductor* Magazine, vol. 7, No. 1 (Jan./Feb. 2001).

* cited by examiner

LASER SEPARATED DIE WITH TAPERED SIDEWALLS FOR IMPROVED LIGHT EXTRACTION

FIELD OF THE INVENTION

The present invention relates to making optoelectronic devices, packages for optoelectronic devices and methods of making the foregoing and particularly relates to light-emitting diodes, packages for light-emitting diodes and methods of making the foregoing.

BACKGROUND OF THE INVENTION

Light-emitting diodes or "LEDs" include thin layers of semiconductor material of two opposite conductivity types, referred to as p-type and n-type. The layers are disposed in a stack, one above the other, with one or more layers of n-type material in one part of the stack and one or more layers of p-type material at the other end of the stack. For example, the various layers may be deposited in sequence on a substrate to form a wafer. The junction between the p-type and n-type material may include directly abutting p-type and n-type layers, or may include one or more intermediate layers which may be of any conductivity type or which may have no distinct conductivity type.

Electrodes are connected to the n-type and p-type layers near the top and bottom of the stack. The materials in the electrodes are selected to provide low-resistance interfaces with the semiconductor materials. The electrodes, in turn, are provided with pads suitable for connection to wires or other conductors which carry current from external sources. The pad associated with each electrode may be a part of the electrode, having the same composition and thickness of the electrode, or may be a distinct structure which differs in thickness, composition, or both from the electrode itself. The term "electrode-pad unit" is used in this disclosure to refer to the electrode and pad, regardless of whether the pad is a separate structure or merely a region of the electrode. The wafer is cut apart to form individual dies which constitute separate LEDs.

In operation, electric current passing through the diode is carried principally by electrons in the n-type layers and by electron vacancies or "holes" in the p-type layers. The electrons and holes move in opposite directions toward the junction, and recombine with one another at the junction.

Energy released by electron-hole recombination is emitted as light. As used in this disclosure, the term "light" radiation includes infrared and ultraviolet wavelength range, as well as the visible range. The wavelength of the light depends on factors including the composition of the semiconductor materials and the structure of the junction.

LEDs formed from certain semiconductor materials normally use nonconductive substrates to promote proper formation of the semiconductor layers. The nonconductive substrate typically is left in place. For example, gallium nitride-based materials such as GaN, AlGaN, InGaN and AlInGaN are used to form LEDs emitting light in various wavelength ranges including blue and ultraviolet. These materials typically are grown on insulating substrates such as sapphire or alumina.

LEDs incorporating an insulating substrate must include a bottom electrode at a location on the stack above the substrate but below the junction. Typically, the upper layer or layers of the stack are removed in a region of the stack, so as to provide an upwardly-facing lower electrode surface on a layer at or near the middle of the stack in each die. This leaves a region referred to as a "mesa" projecting upwardly from the lower electrode surface and covering the remaining area of the die. The area of the die occupied by the lower electrode surface does not emit light. It is desirable to keep the horizontal extent of this inactive area as small as possible. In other LEDs, the upwardly facing lower electrode surface is not formed and a lower electrode is formed on the bottom surface of the stack of semiconductor materials. In these devices, the insulating substrate at the bottom of the stack is omitted.

In either type of LED, the top electrode typically is formed on the top surface of the stack, i.e., the top surface of the top semiconductor layer. Typically, the layers in the stack above the junction are transparent, so that light emitted at the junction can pass out of the stack through the top surface. The top electrode is arranged so that it does not block all of the emitted light. For example, an opaque top electrode may cover only a small portion of the top surface of each die. However, "current crowding" or "current bunching", results in light emission concentrated in that area of the junction beneath the electrode, precisely where it will be most effectively blocked by the electrode. The amount of useful light reaching the outside of the die per unit of electrical current passing through the die, commonly stated as the external quantum efficiency of the die, is reduced by this phenomenon. Current crowding can also occur in the lower region, so that light emission is concentrated in the area of the junction near the lower electrode. Current crowding is a significant consideration with LEDs formed from materials having relatively high electrical resistivity, such as the gallium nitride-based materials.

To alleviate the current crowding problem, LEDs have been provided with transparent top electrodes, formed from thin layers of metals and metal compounds. A pad, which is typically opaque, is connected to the transparent electrode and occupies a small portion of the top surface. The transparent top electrode spreads the current in horizontal directions from the pad, so that current flow down through the stack is spread more evenly over the horizontal extent of the mesa.

Some of the light generated by the LED is subject to total internal reflection and is not emitted by the LED. The principle of total internal reflection is shown in FIG. 1, which shows a light source 32 generating a number of distinct light rays. The light rays pass through a first transparent material 34 having an index of refraction n, that is greater than the index of refraction $n_2$ of a second transparent material 36. A first light ray 40 that is emitted by light source 32 is normal to the interface 38 between the transparent materials and is not altered when passing into the second transparent material 36. However, the direction of travel of a second light ray 42 is altered as it passes from the first transparent layer 34 to the second transparent layer 36. The third light ray 44 is incident upon interface 38 at the critical angle $\theta_c$, as determined using Snell's law, and does not pass into the second transparent layer 36 but is directed along interface 38. Any light ray having an incident angle that is greater than the critical angle $\theta_c$, such as fourth ray 46, is subject to total internal reflection and will be reflected back into first transparent layer 34.

The effect of total internal reflection in an LED will be discussed in connection with the example in FIG. 2. A light-emitting diode ("LED") comprises a semiconductor structure of semiconductor material of two opposite conductivity types, typically referred to as p-type layers 20 and n-type layers 22. The p-type layers 20 and n-type layers 22 are disposed in a stack, one above the other. The LED includes a junction 24 provided at the interface of the p-type and n-type layers. Typically, the stack comprises a wafer for forming a plurality of LED devices. The wafer is then cut apart to form individual devices which constitute the separate LEDs.

FIG. 3 shows a plan view of a semiconductor wafer 48 incorporating a stack of semiconductor materials for a plurality of LED devices 50. The semiconductor wafer 48 includes a plurality of lines printed onto the upper surface of the wafer, called streets 52 and rows 54. The streets 53 and rows 54 divide the devices 50 of the wafer 48. The figures are not to scale and the streets and rows are generally not visible to the human eye but are schematically shown in FIG. 3. The semiconductor wafer 48 is typically separated into the individual devices 50 along the streets 52 and rows 54 using the cutting surface of a cutting wheel, or a conventional laser to cut the upper surface of the wafer.

FIG. 4 shows a conventional method of separating individual devices from a wafer. In FIG. 4, the laser beam 56 is swept across the upper surface 60 of semiconductor wafer 48 to divide the wafer into individual devices. The laser beam is substantially rectangular and approximately 25–35 micrometers wide and 500 micrometers long. The rectangular laser beam image cuts away a portion of wafer 48 to form a substantially rectangular cut 62. The individual devices remain connected by a portion of the wafer underlying the cut. The portion of the wafer 48 underlying the rectangular cut 62 may be called the kerf 64.

FIG. 5 shows a cross-sectional view of an individual device severed from a semiconductor wafer using the rectangular laser beam shown in FIG. 4. The LED is encapsulated in a substantially transparent encapsulant material 130 to form an LED package 128. Encapsulant layer 130 has an index of refraction $n_2$ that is less than the index of refraction $n_1$ of transparent substrate 26. As used herein, the term "refraction" means the optical phenomenon whereby light entering a transparent medium has its direction of travel altered. As a result, when the incident angle $\theta_i$ of a light ray 146 at interface 164 is greater than the critical angle $\theta_c$, the light ray 146 is totally internally reflected back into the substrate 26 and does not pass into the encapsulant layer 130 where the ray can be emitted from the LED package 128.

Because the index of refraction $n_2$ of the substantially transparent substrate 26 is greater than the index of refraction $n_3$ of the transparent encapsulant 130, many of the light rays generated by the LED will not be emitted from the LED package 128, but will be subject to total internal reflection. The optical phenomenon known as total internal reflection, causes light incident upon a medium having a lesser index of refraction (e.g. encapsulant layer) to bend away from the normal so that the exit angle is greater than the incident angle. The exit angle will then approach 90° for some critical incident angle $\theta_c$, and for incident angles $\theta_i$ greater than critical angle $\theta_c$ there will be total internal reflection of the light ray. The critical angle can be calculated using Snell's Law.

In many optoelectronic device packages, the light rays generated are never emitted from the package because such light rays are totally internally reflected within the various layers of the package. Thus, there is a need for packages having designs that optimize the amount of light emitted therefrom.

SUMMARY OF THE INVENTION

In one aspect, a method for separating individual optoelectronic devices from a semiconductor wafer includes directing a laser beam having a width toward a first major surface of the semiconductor wafer to apply a first energy per unit width to a first portion of the wafer located between the devices and a second energy per unit width to a second portion of the wafer adjacent the first portion, the second energy being less than the first energy. The laser beam is swept across the first major surface of the wafer to form a groove and at least one device is separated from the wafer.

The laser cuts into the first major surface for separating the devices from one another. The image geometry of the laser beam directed at the first major surface is preferably manipulated so as to change the shape of the cut which the lasers makes into the wafer. In other words, the intensity of the laser beam is profiled so as to produce a profiled laser beam having a central portion of a first energy level and a peripheral portion of a second energy level that is different than the first energy level. In certain preferred embodiments the first energy level of the central portion is greater than the second energy level of the peripheral portion. However, the peripheral portion may have an energy that is greater than the central portion of the laser beam. The laser beam may cut through the wafer to produce at least one device having a top surface, a bottom surface, and tapered sidewalls extending therebetween. The laser is preferably directed at an upper surface of the wafer in certain embodiments to form a V-shaped groove therein. The bottom surface of the device may have a greater area than the top surface of the device. The laser may also be directed at a lower surface of the wafer to form a V-shaped groove therein. The top surface of the device may have a greater area than the body surface of the device. The wafer preferably incorporates a semiconductor structure for a plurality of light-emitting diodes overlying the substrate.

In certain preferred embodiments, the semiconductor structure comprises material selected from the groove consisting of three-five semiconductors. The substrate may be substantially transparent. The substrate may comprise a sapphire, ZnO, LiGaO, AlN or GaN substrate. The semiconductor structure preferably comprises gallium-nitride base materials and a substrate is preferably made of sapphire. In still other embodiments, the laser beam may have gradients of energy so that the energy varies progressively across the beam when viewing the laser beam in cross-section. The image geometry of the directed laser beam may have any shape. In certain preferred embodiments, the laser beam image is triangular in shape so that the energy at a central portion is greater than at a peripheral portion. The top of the triangle is preferably aligned with the streets and rows of the wafer and the base of the triangle extends in a direction substantially transverse to the streets and rows. Another preferred image may include a diamond shaped laser image having a first major axis substantially parallel to a street or row, and a second major axis transverse to a street or row. Although the present invention is not limited by any particular theory of operation, it is believed that making an LED device having sloping sidewalls will optimize the amount of light emitted by a LED package.

In other preferred embodiments of the present invention, an optoelectronic device includes a stacked semiconductor structure including a first region having a first conductivity type overlying a second region having a second conductivity type and a light-emitting p-n junction therebetween. Outer peripheral surfaces of said structure define tapered sidewalls. The sidewalls may taper outwardly from a top surface to a bottom surface of said substrate so that the bottom surface of the said substrate has a greater area than the top surface. However, in other embodiments, the sidewalls may taper inwardly from the top surface to a bottom surface of said substrate so that the top surface has a greater area than the bottom surface of said substrate. A first electrode-pad unit is connected to the first region of a second electrode-pad unit is connected to the second region. In certain preferred embodiments, the LED package includes a GaN LED that is mounted atop a transparent sapphire substrate.

The semiconductor structure preferably comprises material selected from the groove consisting from three–five semiconductors. In certain preferred embodiments, a substrate supports the structure. The substrate may comprise a sapphire, ZnO, LiGaO, AlN or GaN substrate. The semiconductor structure may comprise gallium-nitride based semiconductor materials and the substrate may comprise a sapphire substrate.

In still other preferred embodiments of the present invention, an assembly for separating LED die from a semiconductor wafer includes a support having a top surface for receiving one or more wafers, and a laser adapted to project a laser beam onto the top surface of said support. The laser includes one or more filters for modifying the geometric shape of the laser beam so that the laser beam has a central portion of a first energy per unit width and an outer portion of a second energy per unit width that is different than the first energy. The filter for manipulating the image geometry of the laser beam may include opaque filters or optical lenses or a combination of opaque filters and optical lenses. In certain embodiments, the first energy of the central portion of the laser beam is greater than the second energy of the peripheral portion of the laser beam. However, in other preferred embodiments, the peripheral portion of the laser beam may have a greater energy level than the central portion of the laser beam. The laser beam may also be modified to produce a laser having a gradient of differing energy levels.

DETAILED DESCRIPTION OF THE PREFERRED EMBODIMENTS

Figure 1:
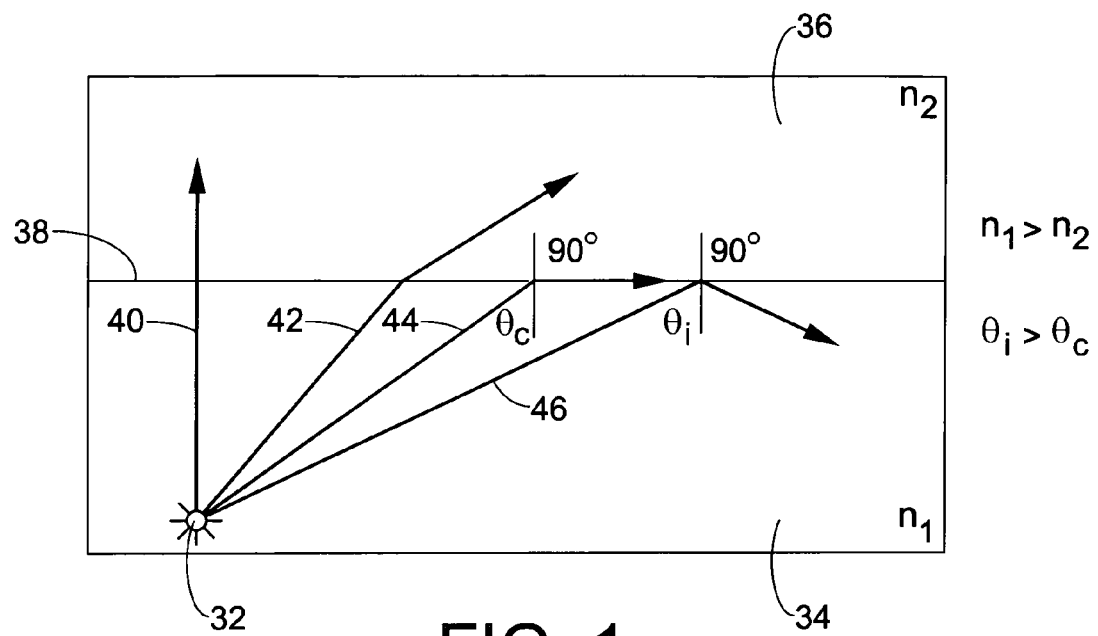
FIG. 1 shows cross-sectional view of transparent media with light traveling therethrough.
Figure 2:
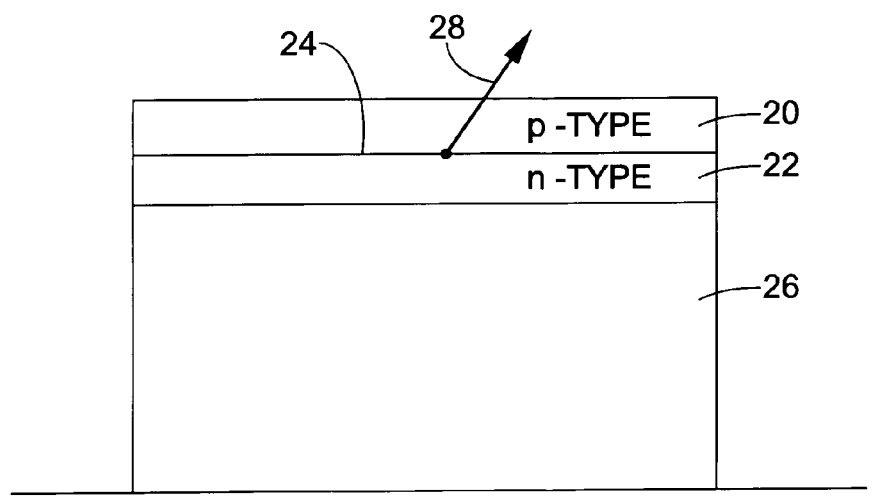
FIG. 2 shows a cross-sectional schematic view of a conventional LED.
Figure 3:
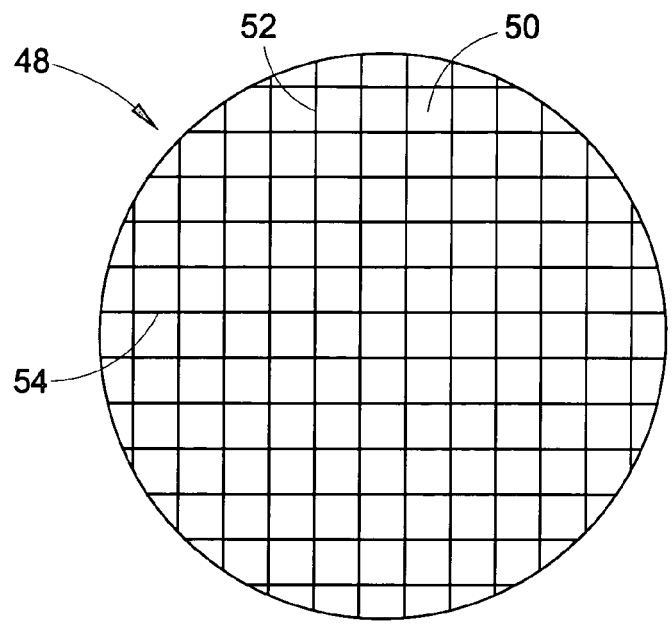
FIG. 3 shows a plan view of a conventional semiconductor wafer.
Figure 4:
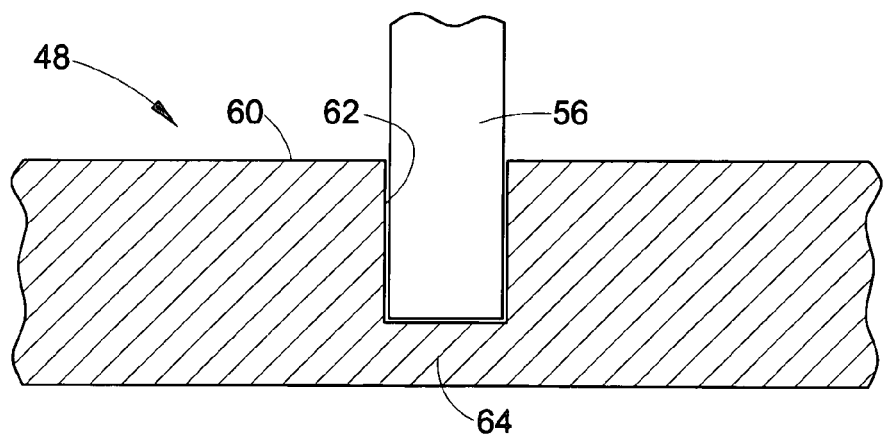
FIG. 4 shows a partial, cross-sectional view of the wafer of FIG. 3.
Figure 5:
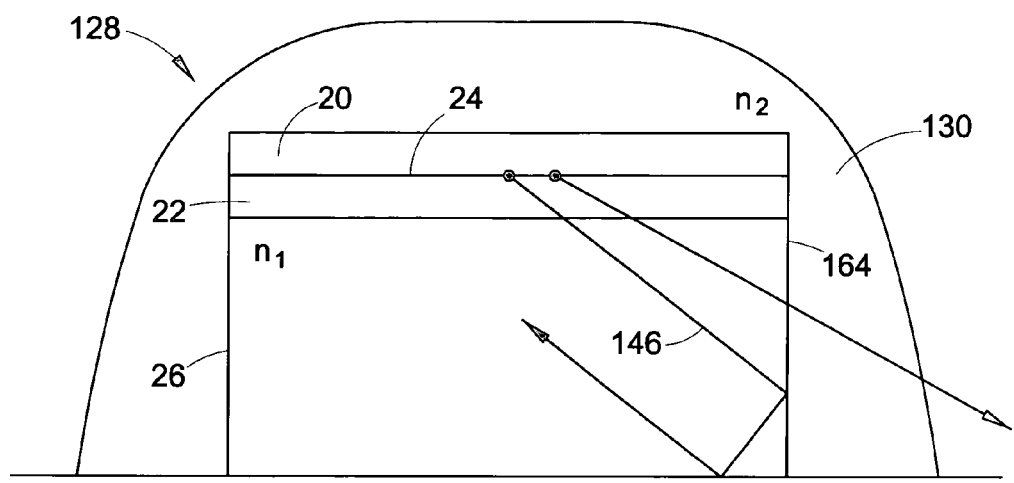
FIG. 5 shows a fragmentary cross-sectional view of a conventional LED package including the LED of FIG. 4.

FIGS. 6A–12 show a method for separating individual optoelectronic devices from a semiconductor wafer in accordance with one embodiment of the invention. A semiconductor structure 210 comprising a stacked structure of semiconductor layers is formed by depositing a semiconductor material having a first conductivity type, for example, one or more n-type layers 222. A semiconductor material having a second conductivity type is deposited over the semiconductor material of the first conductivity type. One or more p-type layers 220 having a top surface 272 are deposited over the n-type layers 222. A junction 224 is also formed between the n-type layers 222 and p-type layers 220.

The stacked structure 210 comprises a semiconductor wafer for a plurality of LEDs including a junction 224 between the n-type layers 222 and p-type layers 220. The junction is shown schematically in FIG. 10 as the border between directly abutting p-type and n-type layers, but may also comprise one or more layers between the p-type layers and n-type layers. The junction may comprise intermediate layers having any conductivity type or no conductivity type. Alternatively, the junction may include additional structures in between the p-type layers 160 and n-type layers 158 or in an intermediate region. Thus, the junction may be a simple homojunction; a single heterojunction, a double heterojunction, a single quantum well, a multiple quantum well or any other type of junction structure. A person of ordinary skill in the art will appreciate that the semiconductor structure may incorporate various layers of semiconductor materials, as well as other structures used in the optoelectronic arts.

Also, each of the p-type layers 220 and n-type layers 222 can include any number of layers. Merely by way of example, the structure can incorporate a "buffer layer" at the interface with substrate 226, whereas a highly doped contact layer at the top of the stack may be included to aid in establishing ohmic contact with an upper electrode discussed below. The p-type layers 220 are typically transparent to light at the wavelength which will be emitted by the LED in service. That is, the upper region is formed entirely or principally from materials having a band gap greater than the energy of the photons which will be emitted at the junction. The structure and composition of the various layers incorporated in the stack and the sequence of layers in the stack may be selected according to known principles and techniques to provide the desired emission characteristics.

In certain preferred embodiments, the semiconductor structure 210 comprises gallium-nitride based semiconductor materials such as GaN, AlGaN, InGaN, and AlIn GaN, which are used to form LEDs emitting light in various wavelength ranges including blue and ultraviolet. The fabrication processes used to form the stacked structure are well known. The materials are typically grown on the insulating substrate 150 by chemical vapor deposition ("CVD"), metal organic chemical vapor deposition ("MOCVD"), molecular beam epitaxy, and the like. However, those of ordinary skill in the art will appreciate that a number of other semiconductor materials for forming other types of optoelectronic devices, including LEDs, may be used. The insulating substrate can comprise any substrate that is not opaque to the emitted light, such as sapphire, alumina, silicon carbide, gallium nitride, or aluminum gallium nitride, for example. In other embodiments, the substrate is omitted.

The semiconductors deposited may be III-V semiconductors, i.e., materials according to the stoichiometric formula $Al_aIn_bGa_cN_xAs_yP_z$ where (a+b+c) is about 1 and (x+y+z) is also about 1. Most typically, the semiconductor materials are nitride semiconductors, i.e., III-V semiconductors in which x is 0.5 or more, most typically about 0.8 or more. Most commonly, the semiconductor materials are pure nitride semiconductors, i.e., nitride semiconductors in which x is about 1.0. The term "gallium nitride based semiconductor" as used herein refers to a nitride based semiconductor including gallium. The p-type and n-type conductivity may be imparted by conventional dopants and may also result from the inherent conductivity type of the particular semiconductor material. For example, gallium nitride based semiconductors typically are inherently n-type even when undoped. N-type nitride semiconductors may include conventional electron donor dopants such as Si, Ge, S, and O, whereas p-type nitride semiconductors may include conventional electron acceptor dopants such as Mg and Zn.

It should be appreciated that the figures are not drawn to scale. In particular, the thicknesses of the various layers have been greatly exaggerated for clarity of illustration. Typically, the entire stack is on the order of five microns thick. The horizontal dimensions, such as the overall width and length are on the order of a few hundred microns as, for example, about 200–300 microns.

Furthermore, the wafer may comprise various semiconductor materials for forming optoelectronic devices, as in known in the art.

A first electrode-pad unit is formed connected to the semiconductor material having the first conductivity type and a second electrode-pad unit is formed connected to the second conductivity type material. In certain embodiments, a lower upwardly-facing surface is formed in n-type layer 222 and a mesa is formed so as to project upwardly from the lower surface. An upper electrode-pad unit is formed on top surface of mesa. And a lower electrode-pad unit is formed on lower surface. The electrode-pad units comprise a conductive material such as a conductive metal. Preferred conductive metals include gold, aluminum or silver.

In certain preferred embodiments, the electrode-pad unit on an upper portion of the semiconductor structure comprises a transparent upper electrode covering a substantial portion of a entire top surface of the structure. The upper electrode is formed from a material which will provide a low resistance, desirably ohmic contact, with the semiconductor material defining the top surface. The composition and thickness of the transparent electrode are selected to provide substantial transparency to light at the wavelength which will be emitted by the LED in service. Suitable materials, thicknesses and processing techniques for forming transparent electrodes to be used with particular semiconductor materials are well known. Merely by way of example, one suitable upper electrode for use where the top surface 166 is defined by p-type gallium nitride can be formed by applying a layer of nickel, typically about 10 to about 500 Å thick and a layer of gold, typically about 10 to about 500 Å thick, onto the top surface and annealing the contact in an oxidizing atmosphere at an elevated temperature as, for example, about 300–900° C. so as to oxidize the nickel. The layers of metal are applied using electron beam deposition, sputter deposition, plating, or other known methods. Preferably, the metals for upper electrode are deposited so as to avoid depositing metal overlapping with the electrode to be formed on the lower electrode surface, which can short out the device.

The upper electrode-pad unit also preferably includes a first pad formed on the top surface of upper electrode at or near the horizontal center of the top surface. First pad is formed from appropriate materials to provide a terminal which can be connected to an external lead or contact in service as, for example, by wire bonding the lead to the pad. The materials of the pad should also be compatible with the materials in the upper electrode. Merely by way of example, first pad may include a layer of titanium overlying the transparent electrode; a layer of platinum overlying the titanium layer and a layer of gold overlying the platinum layer. The exposed layer of gold provides a suitable surface for wire bonding. The first pad typically has a diameter of about 100–120 microns. Desirably, this pad is as small as possible consistent with the requirements of the bonding operation used to connect the pad to external circuitry. In other preferred embodiments, the upper electrode-pad unit comprises a small pad directly on the top surface without a transparent electrode at the top surface. In other embodiments, the upper electrode comprises an electrode that is essentially opaque to the light emitted by the device.

A second electrode-pad unit is provided at or near an opposite end of the structure. This electrode-pad unit preferably comprises a second pad on surface of the structure. For example, where the first electrode-pad unit is connected to the p-type layers, the second electrode-pad unit is connected to the n-type layers. Second pad may be, for example, about 100 microns wide. The second pad is formed from electrically conductive materials which make a good, desirably ohmic electrical contact with the lower surface. For examples where the lower surface is formed by n-type gallium nitride, the second pad may be formed from layers of aluminum and titanium which are annealed at an elevated temperature. The second pad also preferably includes layers adapted for bonding to external leads or other structures. For example, the second pad may include a layer of platinum over the titanium and aluminum layers and a layer of gold over the platinum layer. The gold layer provides a good bonding surface. In a particularly preferred arrangement for use with gallium nitride-based semiconductors, the entire lower electrode-pad unit is formed from layers of aluminum, titanium, platinum and gold, deposited in that order and then annealed.

Figure 6A:
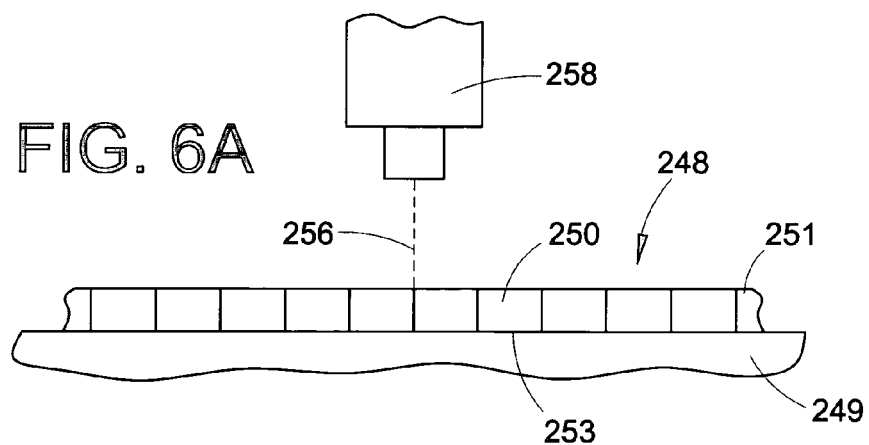
FIG. 6A shows a partial cross-sectional view of a wafer in a method in accordance with an embodiment of the invention.
Figure 6B:
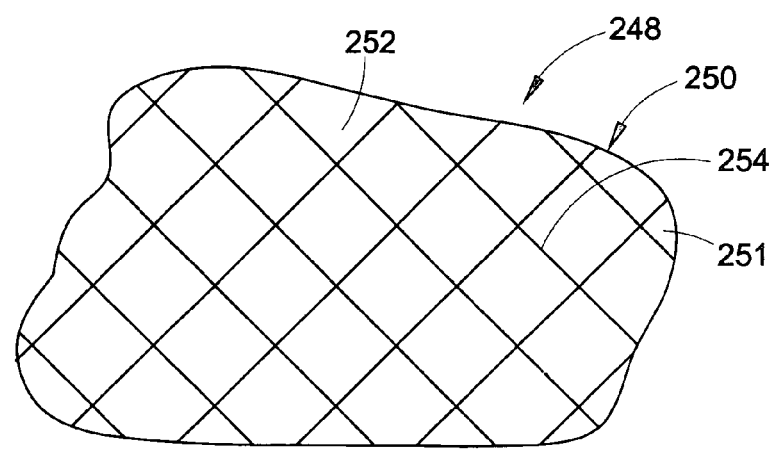
FIG. 6B shows a partial top plan view of a wafer in a method in accordance with the embodiment of FIG. 6A.

After the wafer is formed, the individual devices are separated from the wafer. FIG. 6A shows a semiconductor wafer 248 on a support 249 in an apparatus for separating an optoelectronic device 250 from a wafer 248 incorporating semiconductor materials for a plurality of optoelectronic devices. The apparatus has a laser 258 for cutting the semiconductor materials. The wafer 248, in certain preferred embodiments, incorporates semiconductor materials for a plurality of devices comprising LEDs. The wafer 248 has an upper surface 251 and a lower surface 253 facing in a direction opposite from the upper surface 251. The semiconductor wafer 248 has a plurality of streets 252 extending in a first direction on the upper surface and a plurality of rows 254 extending in a second direction, transverse to the first direction, on the upper surface. The streets 252 and rows 254 comprise printed lines on the wafer and generally demarcate a grid of individual devices of the wafer 248.

The upper surface 251 of the wafer 248 is preferably covered with a protective layer. The protective layer may comprise a photoresist.

The laser 258 is guided by a computer system, as is known in the art, to cut the wafer 248 into the individual LEDs along the streets 252 and rows 254. The streets 252 and rows 254 may comprise imaginary lines comprising data in the computer for manipulating the laser 258, the support 249, or both, so as to cut the wafer 248 into the individual LEDs 250. However, a point of reference on the wafer 248 is required to position the wafer 248 according to the data and properly separate the individual devices.

Figure 7:
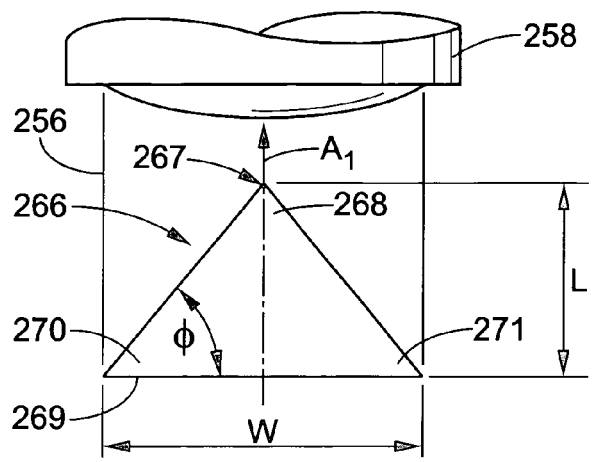
FIG. 7 shows a schematic elevation view of a laser beam in the method of FIGS. 6A–6B.
Figure 9:
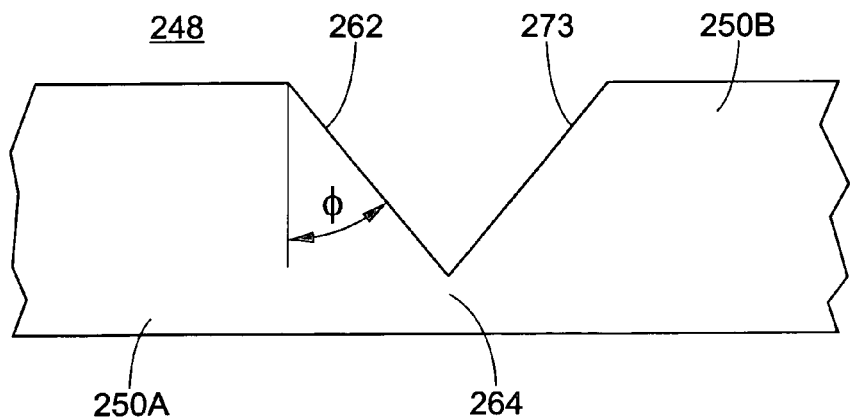
FIG. 9 shows a fragmentary cross-sectional view of a semiconductor wafer in a method in accordance with the embodiment of FIGS. 6A–8.

Referring to FIG. 7, the image of the laser beam 256 produced by the laser 258 is geometrically manipulated, such as by using filters or optical lenses, to provide a shaped laser beam image 266 for making a cut in the wafer that has a profile with a predetermined shape. In certain preferred embodiments, and as shown in FIG. 7, the laser beam image 266 has a triangular shape for producing a triangular cut in the semiconductor wafer, as shown in FIG. 9. The substantially triangular-shaped laser beam image 266 is swept across the first surface of the wafer in the direction indicated by the arrow designated $A_1$ so that a first corner 267 of the triangular laser beam image reaches a portion of the wafer 248 before a second corner 269 and third corner 271. The first corner 267 is preferably aligned with the rows 254 and streets 252 of the wafer 248 as the laser beam image 266 is swept across the wafer 248. The substantially triangular-shaped laser beam image 266 has a central portion 268 having a first energy per unit width "W" and an outer portion 270, lying outwardly from the central portion 268, having a second energy per unit width "W". The portions of the image 266 having a greater length "L" apply more energy to the wafer, producing a deeper cut.

Figure 8:
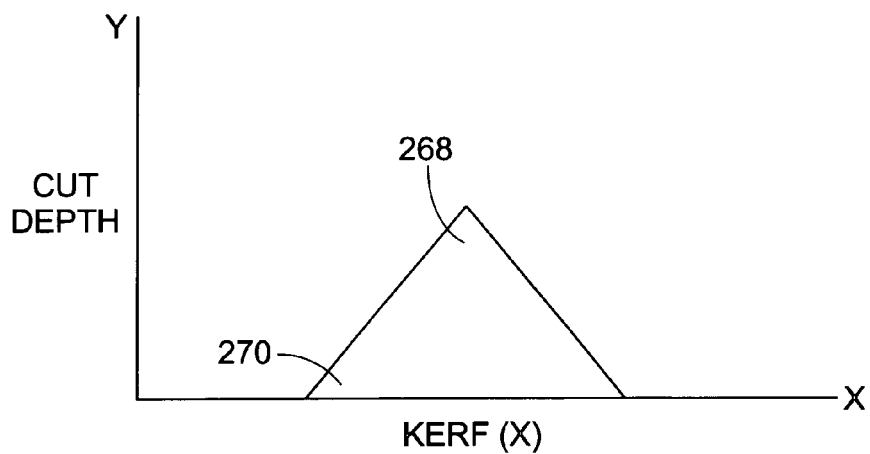
FIG. 8 shows a graph depicting the cut depth obtained using the laser beam of FIGS. 6A–7.

As depicted in the graph shown in FIG. 8, the central portion 268 of the laser beam 256 cuts the wafer 248 to a greater depth than the peripheral portion 270 of the laser beam 256. Thus, as shown in FIG. 9, the triangular-shaped laser beam image 266 produces a cut 262 in wafer 248 having sloping sidewalls 273 and kerf 264. The cut 262, produced along the streets 252 and rows 254 of the wafer 248, divide the wafer 248 into the individual LEDs 250. The protective layer is removed from the wafer to remove any debris formed during the laser cutting. The LEDs 250A, 250B are then separated at kerf 264 utilizing a mechanical breaker, comprising a roller. A cutting wheel or laser may also be used to break the kerf 264.

Figure 10:
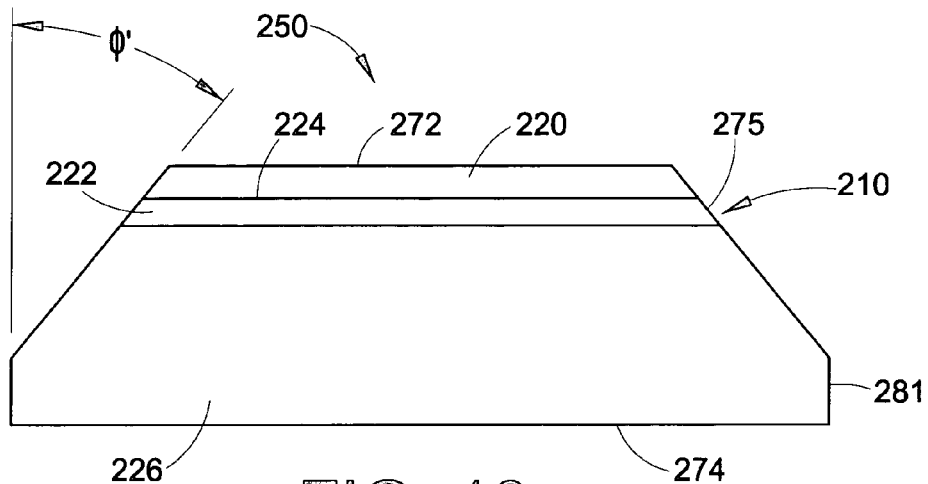
FIG. 10 shows a front elevation view of an LED in the method in accordance with the embodiment of FIGS. 6A–9.
Figure 11:
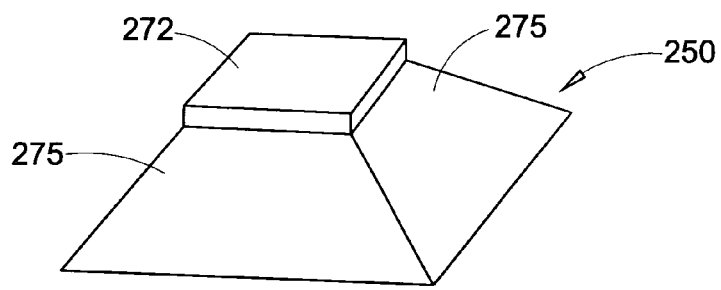
FIG. 11 shows a perspective view of the LED of FIG. 10.

FIG. 10 shows a front elevation view of an LED formed using the substantially triangular-shaped laser shown and described in connection with FIG. 6A-9 above. LED 250 comprises a semiconductor structure having p-type layers 220 formed on n-type layers 222 with a junction 224 therebetween. The semiconductor structure is disposed on a substantially transparent substrate 226, such as a sapphire substrate. The LED has a top surface 272, a bottom surface 274, and sidewalls 275. Due to the use of a substantially triangular-shaped laser beam image, the sidewalls 275 of the LED 250 slope outwardly at an angle. The sidewalls 275 extend from the top surface 272 toward the bottom surface 274 of LED 250. The LED has a vertically extending surface 281 at the kerf 264 of the cut 262, where the laser beam did not penetrate the substrate. However, in other preferred embodiments, the apparatus is arranged to penetrate the substrate and substantially eliminate the vertical surfaces. The wafer may also be polished to remove the substrate adjacent the kerf 264.

The LED device is then formed into a package. The first pad and second pad are connected by conductive features, which may comprise wire bonds 184 and, to an external electrical power source. Current flows between pads and through the electrodes and through the stacked structure, so that light is emitted at junction 224. The light is emitted out of the structure, through the transparent first electrode and other surfaces of the structure.

The LED subassembly may be adhered to a second substrate, such as a printed circuit board, using an adhesive, such as a thermally conductive adhesive to form the package.

Preferably, a reflector, comprising a layer of reflective material, is disposed between the LED and second substrate. The LED package is then electrically interconnected with the second substrate 176. The electrically interconnected LED package may be encapsulated with a substantially transparent encapsulant 230. Preferred encapsulants include elastomers, polymers and epoxies.

Figure 12:
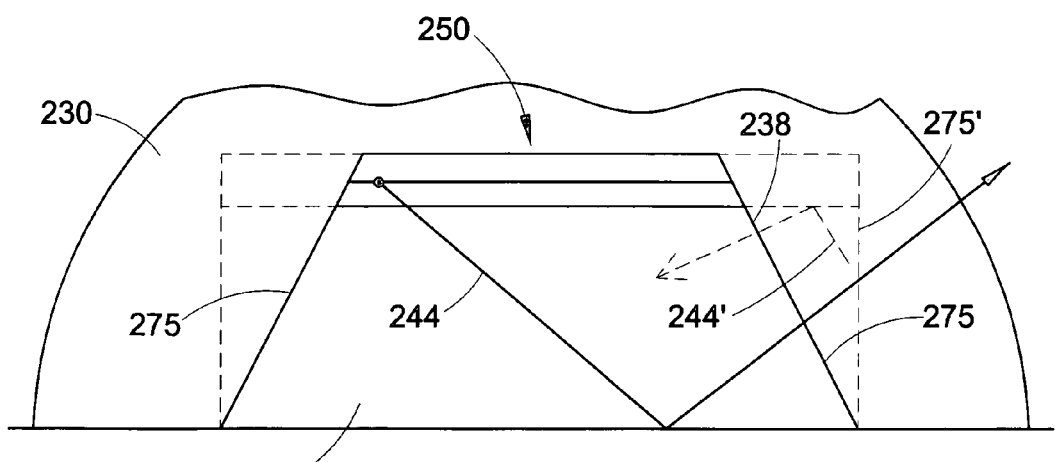
FIG. 12 shows a fragmentary elevation view of an LED package having the LED of FIG. 11.

FIG. 12 shows an LED package incorporating LED 250. Due to the outwardly sloping walls 275 of LED 250, a light ray 244 will have an incident angle $\theta_i$ that is substantially normal to sidewall 275. As a result, light ray 244 will pass readily through interface 238 between substrate 226 and encapsulant 230 so as to be emitted from the LED package. The dashed lines in FIG. 12 show the path of the same light ray 244 if the sidewalls 275' are substantially vertical. As shown by the dashed lines, the light ray 244' would have an incident angle $\theta_i$ that is greater than the critical angle $\theta_c$. As a result, the light ray 244' is reflected back into the substrate 226. Thus, it can be seen that providing an LED package with an LED having sloping walls will optimize the number of light rays emitted from the LED package.

Figure 13:
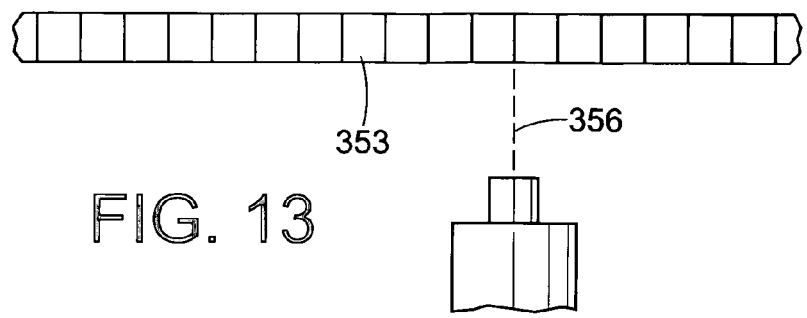
FIG. 13 shows a cross-sectional view of a semiconductor wafer in a method in accordance with a further embodiment of the present invention.
Figure 14:
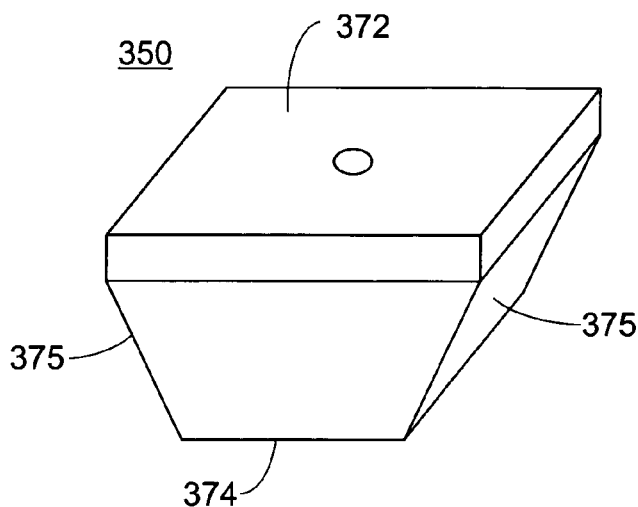
FIG. 14 shows a perspective view of an LED in a method in accordance with the embodiment of FIG. 13.
Figure 15:
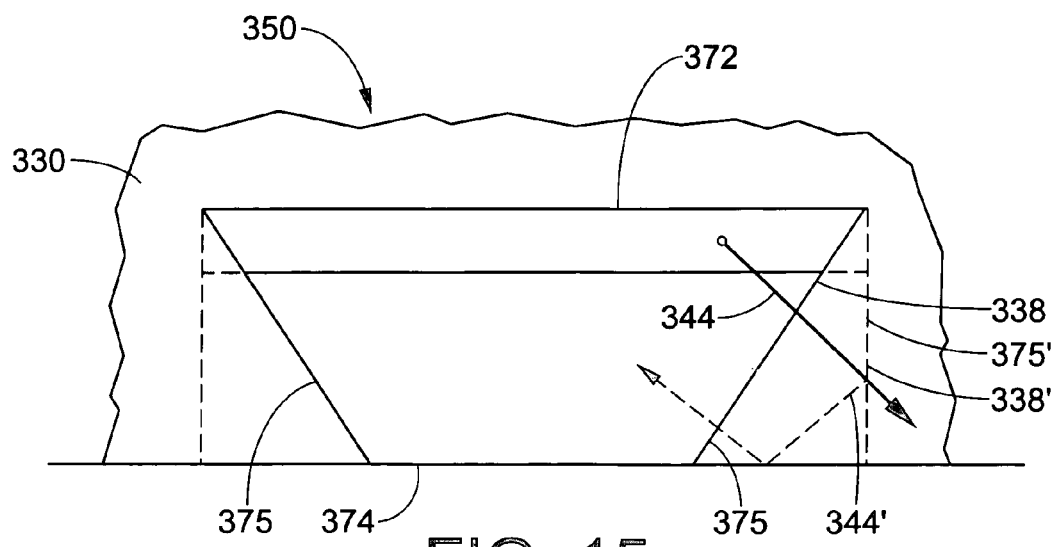
FIG. 15 shows a fragmentary elevation view of an LED package having the LED of FIG. 14.

Referring to FIGS. 13–15, a geometrically manipulated laser beam image is used in a method according to a further embodiment. A laser as shown in FIG. 13 is used to sever wafer 348 by directing the laser beam image 356 at the lower surface 353 of wafer 348, adjacent the substrate. Such a method will produce a die 350 having tapered sidewalls 375 that taper inwardly from a top surface 372 toward a bottom surface 374 of the LED 350. Referring to FIG. 15, because the sidewalls 375 taper inwardly between top surface 372 and bottom surface 374 of the LED 350, the incident angle $\theta_i$ of light ray 344 is substantially normal at the interface 338 between substrate layer 326 and encapsulant layer 330. As a result, light ray 344 will readily pass through interface 338 and into encapsulant layer 330 where it may be emitted from the LED package. The dashed lines show a wall 375' of an LED having vertical walls. As is evident, in a package having vertical walls, the same light ray 344' having a similar incident angle $\theta_i$ will exceed the critical angle $\theta_c$ at the interface 338' and will be totally internally reflected back into substrate 326. Thus, it can be seen that a LED package having internally sloping sidewalls will emit a greater amount of light then will LED packages using the substantially vertical sidewalls produced by prior art methods.

Figure 16:
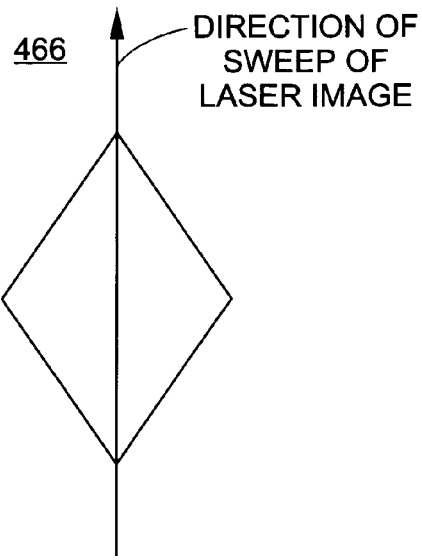
FIG. 16 shows a laser beam image in a method in accordance with another embodiment of the present invention.
Figure 17:
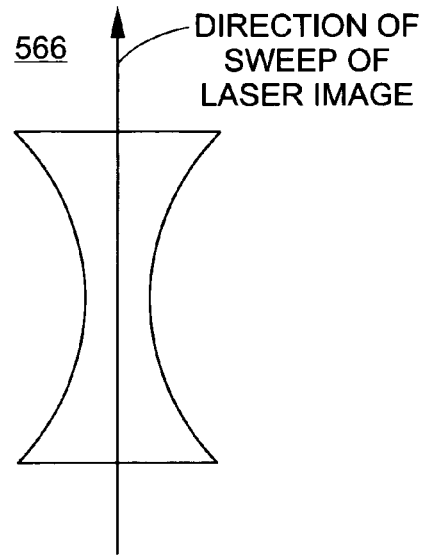
FIG. 17 shows a laser beam image in a method in accordance with a further embodiment of the present invention.
Figure 18:
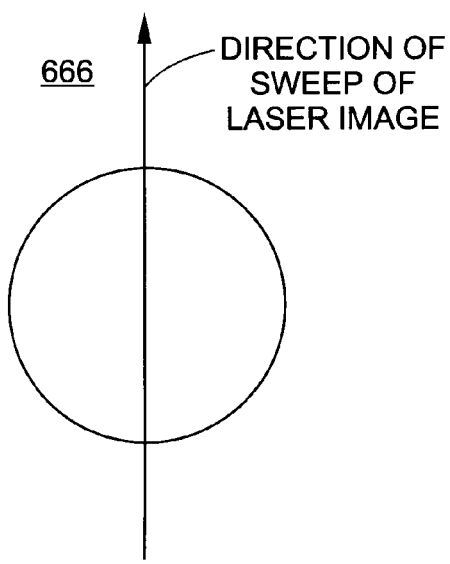
FIG. 18 shows a laser beam image in a method in accordance with a still further embodiment of the present invention.
Figure 19:
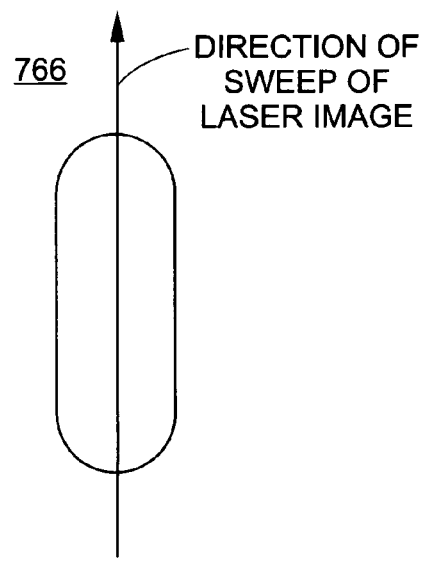
FIG. 19 shows a laser beam image in a method in accordance with another embodiment of the present invention.

In other preferred embodiments, a laser beam having geometrically manipulated images with other shapes are used to cut the wafer. Such laser beam images, are swept across a major face of a wafer, to produce LED that improve the amount of light extracted from the LED. A diamond-shaped image 466 shown in FIG. 16, the elongated image 566 having concave walls of FIG. 17, the circle 666 of FIG. 18 and the elongated oval 766 of FIG. 19 may be used to produce cuts in wafers having corresponding shapes. At portions of the laser beam image that have a greater length, a greater amount of energy is applied to the wafer, than other portions of the image. The shape of the laser beam image produces a predetermined shape for the walls of the LED, so that the incident angle of many light rays generated by the LED is more normal to the wall of the LED and is extracted from the LED.

Figure 20:
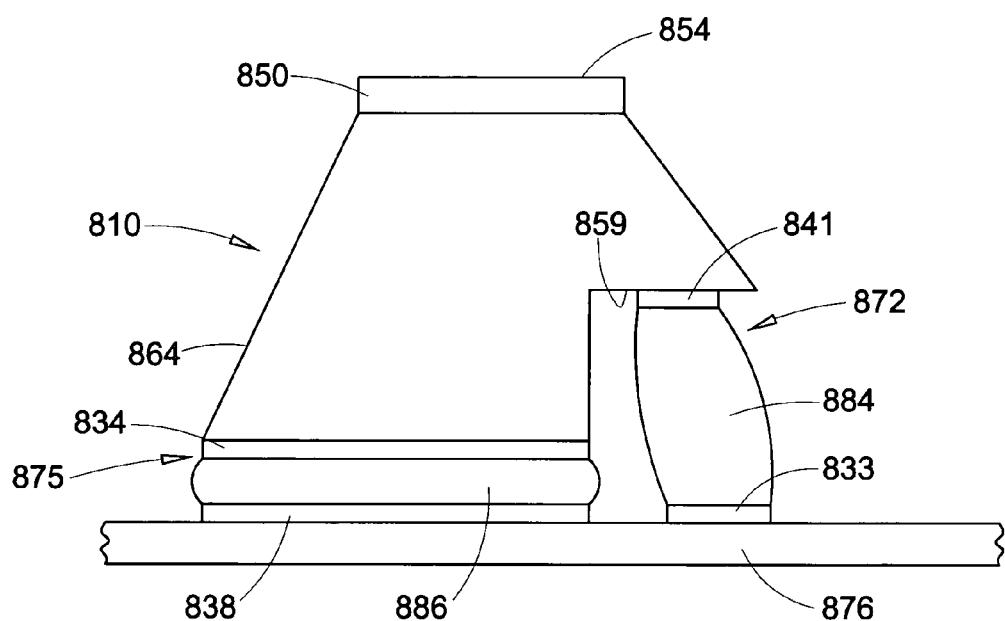
FIG. 20 shows an LED package in accordance with another embodiment of the invention.

Another type of package is shown in FIG. 20. The structure 810 has a substantially transparent back face 854 through which light will be directed. For example, the transparent back face may comprise a sapphire substrate 850.

The structure 810 is a semiconductor structure comprising a stacked structure of p-type, n-type and other semiconductor materials for generating light, as discussed above. The structure 810 has a mesa 864 protruding from the structure and a lower surface 859. An upper electrode-pad unit 875 is mounted on the mesa 864 and has a first pad 834. A lower electrode-pad unit 872 is mounted on the lower surface 859 and has a second pad 841. The first pad connected to a first contact 838 and second contact 833 on a second substrate 876. Structure 810 is bonded to the contacts of second substrate 876 by, for example, disposing masses 886 and 884 of bonding material between each of the pads and contacts. The contacts are also connected to an electrical power source. Thus, light generated by this device is directed out the back face 854. At least some light rays generated at the junction will be directed towards the mesa 864. A reflector mounted within the package may be used to direct light emitted towards the back surface 854, if desired.

Preferably, the first pad 834 comprises a reflective electrode. The reflective electrode may be formed as follows. After the structure 810 having the mesa 664 has been formed, the area for the first pad 834 is defined using a photolithographic mask on the top surface 866 of the mesa 864. Nickel is deposited on the top surface of the mesa 864. Gold is then deposited on the layer of nickel. The metals may be deposited utilizing electron beam deposition, sputter deposition, plating, or other known methods. The foregoing layers of metal are then oxidized so that they become transparent. A layer of reflective metal, such as gold, is then deposited on the oxidized metal. The layer of reflective metal should be thick enough to reflect the light generated by the LED through the back surface 654. For example, where gold is utilized as the reflective metal, 0.2 microns of gold would be reflective. In other embodiments, the layer of reflective metal may comprise titanium. Thus, the layer of reflective metal may be deposited on the first pad 834. In other embodiments, the first pad 834 may be comprised of one or more layers of reflective metal.

The reflective pad 834 reflects light for improved light extraction through the substrate 850. In preferred embodiments, the layer of reflective metal deposited is thick enough so that it can be used to bond the pad 834 to the contact 838.

These and other variations and combinations of the features discussed above can be utilized without departing from the present invention. For example, although preferred shapes for the laser beam image have been discussed above, the laser beam image may have any shape. Thus, the foregoing description of the preferred embodiments should be taken by way of illustration rather than by way of limitation of the invention as defined by the claims.

What is claimed is:

1. A method for separating individual optoelectronic devices from a semiconductor wafer, the method comprising:

directing a laser beam having a width at a first major surface of the wafer to apply a first energy per unit width to a first portion of the wafer located between the devices and a second energy per unit width to a second portion of the wafer adjacent the first portion, the second energy being less than the first energy, a central portion of the laser beam having the first energy and a peripheral portion of the laser beam having the second energy, said laser beam cutting said wafer to produce at least one device having a top surface, a bottom surface, and tapered sidewalls extending therebetween;

sweeping the laser beam across the first major surface to form a groove; and separating at least one device from the wafer.

2. The method as claimed in claim 1, wherein said laser is directed at an upper surface of the wafer to form a V-shaped groove therein.

3. The method as claimed in claim 2, wherein the bottom surface of said device has a greater area than the top surface of said device.

4. The method as claimed in claim 1, wherein said laser is directed at a lower surface of the wafer to form a V-shaped groove therein.

5. The method as claimed in claim 4, wherein the top surface of said device has a greater area than the bottom surface of said device.

6. A method for separating individual optoelectronic devices from a semiconductor wafer, said wafer incorporating a semiconductor structure for a plurality of light-emitting diodes overlying a substrate, the method comprising:

directing a laser beam having a width at a first major surface of the wafer to apply a first energy per unit width to a first portion of the wafer located between the devices and a second energy per unit width to a second portion of the wafer adjacent the first portion, the second energy being less than the first energy;

sweeping the laser beam across the first major surface to form a groove; and separating at least one device from the wafer.

7. The method as claimed in claim 6, wherein a central portion of the laser beam has the first energy and a peripheral portion of the laser beam has the second energy.

8. The method as claimed in claim 6, wherein said semiconductor structure comprises materials selected from the group consisting of III–V semiconductors.

9. The method as claimed in claim 6, wherein said substrate is substantially transparent.

10. The method as claimed in claim 9, wherein said substrate is selected from the group consisting of sapphire, ZnO, LiGaO, AlN and GaN.

11. The method as claimed in claim 6, wherein said semiconductor structure comprises gallium-nitride based materials and said substrate is made of sapphire.

12. The method as claimed in claim 6, wherein the image geometry of the laser beam is manipulated so as to change the shape of the laser beam.

13. The method as claimed in claim 6, wherein the laser beam has gradients of energy so that the energy per unit width varies progressively across the beam.

14. The method as claimed in claim 6, wherein the laser beam is triangular in shape so that the energy per unit width at a central portion is greater than the energy per unit width at peripheral portions of the laser beam.

15. The method as claimed in claim 14, wherein the central portion of the triangular shaped laser beam is aligned with the rows of the wafer.

16. The method as claimed in claim 14, wherein the step of directing a laser beam includes aligning the central portion of the triangular shaped laser beam with streets of the wafer.

17. The method as claimed in claim 16, wherein the step of sweeping the laser beam comprises sweeping the laser beam so that the central portion of the triangular laser beam reaches a portion of the wafer before the peripheral portions.

18. The method as claimed in claim 6, wherein the laser beam has a diamond shape.

19. A method for separating individual optoelectronic devices from a semiconductor wafer that includes a semiconductor structure for a plurality of light-emitting diodes overlying a substrate, the method comprising:

sweeping a laser beam across a major surface of the wafer to form grooves, the laser beam having a first energy per unit width in a central region of the laser beam and a second energy per unit width in a peripheral region of the laser beam, the second energy being less than the first energy, a device separated at the grooves having a top surface, a bottom surface, and tapered sidewalls extending therebetween.

20. The method as set forth in claim 19, wherein the sweeping forms V-shaped grooves.

21. The method as set forth in claim 19, wherein said semiconductor structure comprises materials selected from the group consisting of III–V semiconductors.

22. The method as claimed in claim 19, wherein said substrate is selected from the group consisting of sapphire, ZnO, LiGaO, AlN and GaN.

23. The method as claimed in claim 19, wherein said semiconductor structure comprises gallium-nitride based materials and said substrate is made of sapphire.

24. The method as set forth in claim 19, wherein the laser beam is triangular in shape with the energy per unit width at the center of the laser beam being greater than the energy per unit width at the periphery of the laser beam.

25. The method as set forth in claim 19, further comprising:

geometrically manipulating the laser beam using at least one optical element to produce the laser beam having the first energy per unit width in the central region of the laser beam and the second energy per unit width in the peripheral region of the laser beam.

26. The method as set forth in claim 25, wherein the at least one optical element is selected from a group consisting of filters and lenses.

* * * * *